(12) United States Patent
Boezen (10) Patent No.: US 9,467,060 B2
(45) Date of Patent: Oct. 11, 2016

(54) CAPACITIVE LEVEL SHIFTER DEVICES, METHODS AND SYSTEMS

(71) Applicant: NXP B.V., Eindhoven (NL)

(72) Inventor: Hendrik Boezen, Nijmegen (NL)

(73) Assignee: NXP B.V., Eindhoven (NL)

( * ) Notice: Subject to any disclaimer, the term of this patent is extended or adjusted under 35 U.S.C. 154(b) by 681 days.

(21) Appl. No.: 13/856,184

(22) Filed: Apr. 3, 2013

(65) Prior Publication Data

US 2014/0300188 A1 Oct. 9, 2014

(51) Int. Cl.
| | | |
|---|---|---|
| *H02J 1/00* | (2006.01) | |
| *H02M 5/293* | (2006.01) | |
| *H03K 19/0175* | (2006.01) | |
| *H03K 19/0185* | (2006.01) | |
| *H03K 17/689* | (2006.01) | |

(52) U.S. Cl.
CPC ..... *H02M 5/293* (2013.01); *H03K 19/017509* (2013.01); *H03K 19/018521* (2013.01); *H03K 17/689* (2013.01); *Y10T 307/406* (2015.04)

(58) Field of Classification Search
CPC ................................. H02J 1/00; H02J 3/00
USPC ............................................................ 307/31
See application file for complete search history.

(56) References Cited

U.S. PATENT DOCUMENTS

| | | | |
|---|---|---|---|
| 3,273,033 A | 9/1966 | Rossmeisl | |
| 4,292,595 A | 9/1981 | Smith | |
| 4,748,419 A | 5/1988 | Somerville | |
| 5,138,436 A | 8/1992 | Koepf | |
| 5,187,636 A | 2/1993 | Nakao | |
| 5,187,637 A | 2/1993 | Embree | |
| 5,321,597 A | 6/1994 | Alacoque | |
| 6,271,131 B1 | 8/2001 | Uhlenbrock | |
| 6,331,999 B1 | 12/2001 | Ducaroir | |
| 6,347,395 B1 | 2/2002 | Payne | |
| 6,429,735 B1 | 8/2002 | Kuo | |
| 6,507,226 B2 | 1/2003 | Swonger | |
| 6,636,166 B2 * | 10/2003 | Sessions | H04L 25/4908 341/63 |
| 6,664,859 B1 | 12/2003 | Chen | |
| 6,809,569 B2 | 10/2004 | Wang | |
| 6,839,862 B2 | 1/2005 | Evoy | |

(Continued)

FOREIGN PATENT DOCUMENTS

| | | |
|---|---|---|
| CN | 102340302 A | 2/2012 |
| CN | 102394627 A | 3/2012 |

(Continued)

OTHER PUBLICATIONS

Greg Smith, "Hybrid Isolation Amps Zap Price and Voltage Barriers" Electronic Design, Dec. 11, 1986.

(Continued)

*Primary Examiner* — Rexford Barnie
*Assistant Examiner* — Joseph Inge
(74) *Attorney, Agent, or Firm* — Rajeev Madnawat (57) ABSTRACT

Systems and methods of use relate to a circuit that is designed to detect the state of two control signals, wherein one control signal indicates an ON state for the gate driver and the other control signal indicates an OFF state for the gate driver. The circuit responds to each of the control signals by controlling the gate driver so that it drives an output either high or low. The circuit can also be configured to control the gate driver so that it to drives the output (either high or low) when neither control signal is present.

20 Claims, 5 Drawing Sheets

(56) References Cited

U.S. PATENT DOCUMENTS

| | | | |
|---|---|---|---|
| 6,859,883 B2 | 2/2005 | Svestka | |
| 6,882,046 B2 | 4/2005 | Davenport | |
| 6,920,576 B2 | 7/2005 | Ehmann | |
| 6,992,377 B2 | 1/2006 | Zhou et al. | |
| 7,199,617 B1* | 4/2007 | Schrom | H03K 19/01852 |
| | | | 326/68 |
| 7,302,247 B2 | 11/2007 | Dupuis | |
| 7,376,212 B2 | 5/2008 | Dupuis | |
| 7,400,173 B1 | 7/2008 | Kwong | |
| 7,411,421 B1 | 8/2008 | Steinke | |
| 7,421,028 B2 | 9/2008 | Dupuis | |
| 7,447,492 B2 | 11/2008 | Dupuis | |
| 7,460,604 B2 | 12/2008 | Dupuis | |
| 7,577,223 B2 | 8/2009 | Alfano et al. | |
| 7,650,130 B2 | 1/2010 | Dupuis | |
| 7,732,889 B2 | 6/2010 | Crawley | |
| 7,737,871 B2* | 6/2010 | Leung | H01L 23/48 |
| | | | 257/500 |
| 7,738,568 B2* | 6/2010 | Alfano | H01L 23/66 |
| | | | 375/258 |
| 7,755,400 B2 | 7/2010 | Jordanger et al. | |
| 7,821,428 B2* | 10/2010 | Leung | G06F 13/4072 |
| | | | 341/100 |
| 7,856,219 B2 | 12/2010 | Dupuis | |
| 7,902,627 B2 | 3/2011 | Dong et al. | |
| 8,049,573 B2 | 11/2011 | Alfano et al. | |
| 8,064,872 B2 | 11/2011 | Dupuis | |
| 8,149,017 B2 | 4/2012 | Knierim | |
| 8,169,108 B2 | 5/2012 | Dupuis et al. | |
| 8,284,823 B2 | 10/2012 | Breitfuss | |
| 2001/0052623 A1 | 12/2001 | Kameyama | |
| 2002/0021144 A1* | 2/2002 | Morgan | H03K 19/00315 |
| | | | 326/57 |
| 2002/0184544 A1 | 12/2002 | Svestka et al. | |
| 2002/0186058 A1* | 12/2002 | Prodanov | H03K 19/09429 |
| | | | 327/108 |
| 2003/0214346 A1 | 11/2003 | Pelliconi | |
| 2004/0076192 A1* | 4/2004 | Zerbe | G06F 1/10 |
| | | | 370/516 |
| 2004/0159893 A1 | 8/2004 | Kitahara | |
| 2004/0161068 A1 | 8/2004 | Zerbe | |
| 2005/0127452 A1 | 6/2005 | Rippke | |
| 2005/0174156 A1 | 8/2005 | Wu | |
| 2006/0138595 A1 | 6/2006 | Kiyotoshi | |
| 2007/0075784 A1 | 4/2007 | Pettersson | |
| 2008/0174360 A1 | 7/2008 | Hsu | |
| 2008/0290444 A1 | 11/2008 | Crawley | |
| 2008/0317106 A1 | 12/2008 | Leung | |
| 2009/0146760 A1 | 6/2009 | Reefman | |
| 2009/0213914 A1* | 8/2009 | Dong | H01L 23/48 |
| | | | 375/219 |
| 2009/0237858 A1 | 9/2009 | Steeneken | |
| 2009/0256617 A1* | 10/2009 | Ochi | H03F 3/2173 |
| | | | 327/333 |
| 2010/0052826 A1* | 3/2010 | Callahan | H01L 25/0655 |
| | | | 333/24 R |
| 2010/0118918 A1 | 5/2010 | DuPuis | |
| 2010/0327940 A1 | 12/2010 | Eisenstadt | |
| 2011/0006814 A1 | 1/2011 | Acar | |

FOREIGN PATENT DOCUMENTS

| | | |
|---|---|---|
| EP | 1291918 A2 | 3/2003 |
| EP | 1564884 A1 | 8/2005 |
| GB | 2204467 A | 11/1988 |

OTHER PUBLICATIONS

Wally Meinel, et al., "Hermetic Analog Isolation Amplifier", Proceedings of the 1987 International Symposium on Microelectronics, Minneapolis, Sep. 1987.

Burr Brown, Noise Sources in Applications Using Capacitive Coupled Isolated Amplifiers, Application Bulletin, Burr Brown Corporation, 1993.

Burr Brown, Hybrid Isolation Amps Zap Price and Voltage Barriers, Application Bulletin, Burr Brown Corporation, 1994.

Burr Brown, An error analysis of the ISO102 in a small signal measuring application, Application Bulletin, Burr Brown Corporation, 1994.

Burr Brown, ISO 102, ISO 106 Signal Isolation Buffer Amplifiers, Datasheet, Burr Brown Corporation, 1995.

J. Basilio Simoes, et al., "The Optical Coupling of Analog Signals" IEEE Transaction on Nuclear Science, vol. 43, No. 3, Jun. 1996, pp. 1672-1674.

Stephen L. Diamond, "IEEE 1394: Status and growth path", IEEE Micro, Jun. 1996, pp. 75-78.

Thaddeus J. Gabara, et al., "Capacitive coupling and quantized feedback applied to conventional CMOS technology" IEEE Journal of Solid-State Circuits, vol. 32, No. 3, Mar. 1997.

Adrian Paskins, "The IEEE 1394 BUS", The Institution of Electrical Engineers Conference, May 12, 1997.

Richard Crisp, "Direct Rambus Technology: The New Main Memory Standard" IEEE Micro, Nov./Dec. 1997, pp. 18-28.

Thomas Nilsson, "A distributed combined heat and power plant control unit", Master Thesis, Linköping Institute of Technology, Dec. 16, 1997.

Scott Wayne, "Finding the Needle in a Haystack: Measuring Small differential voltages in the presence of large-common mode voltages", Analog Dialogue, 34-1, 2000, pp. 1-4.

Infineon Technologies, IVAX Integrated Voice & ADSL Transceiver, PEB35512, PEB55508, PEB3558, PEB4565, PEB4566, Datasheet, Infineon Technologies AG, 2001.

William B. Kuhn, et al., "An RF-based IEEE 1394 Ground Isolator designed in silicon-on-insulator process" Circuits and Systems, 2001. MWSCAS 2001. Proceedings of the 44th IEEE 2001 Midwest Symposium on ,vol. 2 , Aug. 14-17, 2001.

Scott Irwin, XILINX, "Usage Models for multi-gigabit serial transceivers", WP157, V.1.0, Mar. 15, 2002.

phyCORE-MCF548x Hardware Manual, PHYTEC Technology Holding Company, Jan. 2005.

LANTRONIX, Xpress-DR+Wireless, Datasheet, LANTRONIX, 2006.

Eugenio Culurciello, et al., "Capacitive inter-chip data and power transfer for 3-D VLSI" IEEE Trans. Circuits Syst. II, vol. 53, No. 12, pp. 1348-1352, 2006.

Geoffrey Marcus, et al., "A Monolithic Isolation Amplifier in silicon-on-isolator CMOS: Testing and Applications", Analog Integr. Circ. Sig. Process, Jun. 27, 2006.

Inoue, A., et al "A high efficiency, high voltage, balanced cascode FET", IEEE International Microwave Symposium, Jun. 1995.

S. M. Sze, "Semiconductor Devices Physics and Technology", 2nd Edition, John Wiley and Sons, Inc., pp. 493-494 and 503-507, 1985, 2002.

Burr Brown, ISO 103, Low Cost, Internally Powered Isolation Amplifier, IC Publication Datasheet, Burr Brown Corporation, 1989.

Stephen Mick, et al., "Packaging Technology for AC Coupled Interconnection", IEEE Flip-Chip Conference, 2002.

Abedinpour S., Bakkoglu B., with Integrated Output Filter in 0.18 m SiGe Process, IEEE Kiaei S., A Multistage Interleaved Synchronous Buck Converter Transactions on Power Electronics, vol. 22, No. 6, Nov. 2007.

Aoki I., Kee S., Magoon R., Aparicio R., Bohn F., Zachan J., Hatcher G., McClymont D., Hajimiri A., "A Fully Integrated Quad-Band GSM/GPRS CMOS Power Amplifier", International Solid-State Circuits Conference, 2007.

Kursun V., Narendra S.G., De V.K., Friedman E.G., "High input voltage step-down DC-DC converters for integration in a low voltage CMOS process", Quality Electronic Design, 2004.

Rocha J., Santos M., Dores Costa J.M., Lima F., "High Voltage Tolerant Level Shifters and DCVSL in Standard Low Voltage CMOS Technologies", IEEE, 2007.

(56) References Cited

OTHER PUBLICATIONS

Sonsky J., Heringa A., Perez-Gonzalez J., Benson J., Chiang P.Y., Bardy S., Volokhine I."Innovative High Voltage transistors for complex HV/RF SoCs in baseline CMOS", IEEE, 2008.

Infineon Technologies, Munzer, M., et al., "Coreless Transformer a New Technology for Half Bridge Driver IC's", The Fifth International Conference of Power Electronics and Drive System, 2003.

Silicon Labs, Si8410/20/21, ISOPRO Low-Power Single and Dual-Channel Digital Isolators, Rev. 1.2, Dec. 2009.

Forster, "Digital isolation in hybrid and electric vehicles," EETimes Automotive, Oct. 6, 2010.

International Rectifier, Gate Driver Ics, Product Data Sheet, available at: http://www.irf.com/product-info/cic/fsgatedriverics.html, 2013.

\* cited by examiner

CAPACITIVE LEVEL SHIFTER DEVICES, METHODS AND SYSTEMS

Aspects of various embodiments are directed toward level shifter circuits, systems and uses thereof.

Gate driver circuits can be used to control the switching of transistors for a variety of applications including, but not limited to, direct current (DC) to DC converters and alternating current (AC) to DC converters. The gate driver circuit can be configured and arranged to generate an output signal with sufficient drive strength and other signal characteristics. For instance, gate driver circuits can be used to convert a control signal into an output drive signal sufficient to control the switching of a power/output transistor used in a voltage converter circuit.

In certain applications, the output transistor is designed to operate in a voltage domain different from the voltage domain from where the control signal is being generated. This is particularly useful for when the output transistor is configured to operate in a high voltage domain. In order to control such an output transistor, the control signal can be first sent through a level shifting circuit (a "level shifter"). This level shifting circuit can be designed to provide isolation between the voltage domains. In particular instances, this isolation can be provided using capacitive isolation; however, other isolation techniques are also possible.

High-side gate drivers are used to drive a MOSFET or IGBT that is connected to the positive supply and is not ground-referenced (e.g., floating). High-side drivers are more complicated than low-side drivers because of the required voltage translation to the supply and because it can be more difficult to turn off a floating transistor.

In certain instances, NMOS transistors can be used to set a value of a memory circuit (e.g., a latch). The memory circuit can then be used to determine/set the state of the high-side gate driver circuit. In particular, a current pulse can be provided to the NMOS transistor, which is tied to the high voltage of the second voltage domain. If the drain voltage of an NMOS transistor is not higher than the source voltage, the NMOS transistor may not turn on properly. Moreover, the required operating parameters of such NMOS transistors can be prohibitive due to the high voltage requirements. These parameters can include a large area and a high breakdown voltage. Moreover, the state of the memory/latch may be unknown at power up, and therefore may damage the circuit by performing in undesirable manners at startup (e.g., by having the high-side transistor enabled at the wrong time).

When gate drivers use high voltage transistors, there can be rapid voltage swings (a high dV/dt). Due to high current peaks through the parasitic capacitances of the transistors, the gate drivers may need to provide a relatively high drive current in order to meet the switching demands of the system. Control logic can be used to detect a control signal, which can be provided using a short current pulse that indicates the desired state for the gate driver circuit. The desired state can then be maintained by storing the state in a memory element that is overridden by a subsequent current pulse.

Aspects of the present disclosure are directed toward circuits, devices and methods for providing a level shifting function between a control signal and a gate driver.

Various example embodiments are directed to isolating and level shifting circuits and their implementation.

According to an example embodiment, a system includes a circuit that is designed to detect the state of two control signals, wherein one control signal indicates an ON state for the gate driver and the other control signal indicates an OFF state for the gate driver. The circuit responds to each of the control signals by controlling the gate driver so that it drives an output either high or low. The circuit can also be configured to control the gate driver so that the output is driven (either high or low) when neither control signal is present.

The present disclosure also contemplates embodiments that are directed toward a first signal driver circuit which is configured and arranged to generate a first signal with information that is encoded using a presence or an absence of a carrier wave. A second signal driver circuit is configured and arranged to generate a second signal with information that is encoded using the presence or absence of a carrier wave. These two signal driver circuits can be operated and located in a first voltage domain. A first signal path capacitively couples the first signal to the first input, while a second signal path capacitively couples the second signal to the second input. In the second voltage domain, a first determination circuit can be configured and arranged to detect the presence of a carrier wave on a first input. A second determination circuit, also in the second voltage domain, can be configured and arranged to detect the presence of a carrier wave on a second input. A first output circuit then drives, in response to a detection of a carrier wave from the first determination circuit, an output node to a high voltage in the second domain. A second output circuit drives, in response to a detection of a carrier wave from the second determination circuit, the output node to a low voltage in the second domain.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving level shifting circuits that can be useful for interfacing with gate driver circuits. While not necessarily so limited, various aspects may be appreciated through a discussion of examples using this context.

Various example embodiments are directed to a system that provides level shifting of a control signal for a high-side gate driver circuit. The level shifting circuit can be designed to receive a pair of control signals that indicate the desired state of the gate driver circuit. Particular embodiments are directed toward a level shifting circuit that can operate in a stateless manner (e.g., without storing the current drive state in a memory/latch circuit). For instance, the level shifting circuit can be configured and arranged to respond to control signals that continuously provide an indication of the desired drive state (e.g., active or inactive). Moreover, embodiments can be directed toward the use of isolation between the control signal and the output of the level shifter. This can be particularly useful for avoiding problems associated with (unknown) startup conditions.

Certain embodiments are directed toward a system that uses capacitive isolation between the control signal and the output of a level shifter circuit. A circuit can be designed to provide control signals that maintain an indication of the desired drive state across the capacitive isolation. For instance, the control signals can be provided as AC signals encoded using an ON-OFF keying protocol. The level shifter circuit can be configured and arranged to detect the presence or absence of the control signals and to enable the gate driver in response thereto.

Various embodiments are directed toward a system and its use. The system can include a level circuit that is designed to detect the state of two control signals, wherein one control signal indicates an ON state for the gate driver, and the other control signal indicates an OFF state for the gate driver. In certain embodiments, the level shifting circuit responds to each of the control signals by controlling the gate driver so that it drives an output either high or low. The level shifting circuit can also be configured to control the gate driver so that it drives the output (either high or low) when neither control signal is present.

The present disclosure also contemplates embodiments that are directed toward a first signal driver circuit which is configured and arranged to generate a first signal with information that is encoded using a presence or an absence of a carrier wave. A second signal driver circuit is configured and arranged to generate a second signal with information that is encoded using the presence or absence of a carrier wave. These two signal driver circuits can be operated and located in a first voltage domain.

A first signal path can be provided in order to capacitively couple the first signal to the first input, while a second signal path can be provided to capacitively couple the second signal to the second input.

In the second voltage domain, a first determination circuit can be configured and arranged to detect the presence of a carrier wave on a first input. A second determination circuit, also in the second voltage domain, can be configured and arranged to detect the presence of a carrier wave on a second input. A first output circuit then drives, in response to a detection of a carrier wave from the first determination circuit, an output node to a high voltage in the second domain. A second output circuit drives, in response to a detection of a carrier wave from the second determination circuit, the output node to a low voltage in the second domain.

Embodiments of the present disclosure can be particularly useful for providing a stateless level shifter circuit that is designed to control high-side gate drivers. When implemented in a stateless configuration, the desired state of the gate (ON or OFF) does not need to be stored in a memory, such as in a latch.

When a high-side gate driver circuit is switched on, the voltage of the driver circuit swings up at a very high rate (e.g., 5-50 V/ns). Thus, level shifter transistors can be subject to induced common mode currents. These induced currents can cause problems with the enablement of the device (e.g., the induced current can be greater than the current of the control signals or pulses). Accordingly, embodiments of the present disclosure can be useful for avoiding the need to provide control signals current that are larger than the expected induced current.

Figure 1:
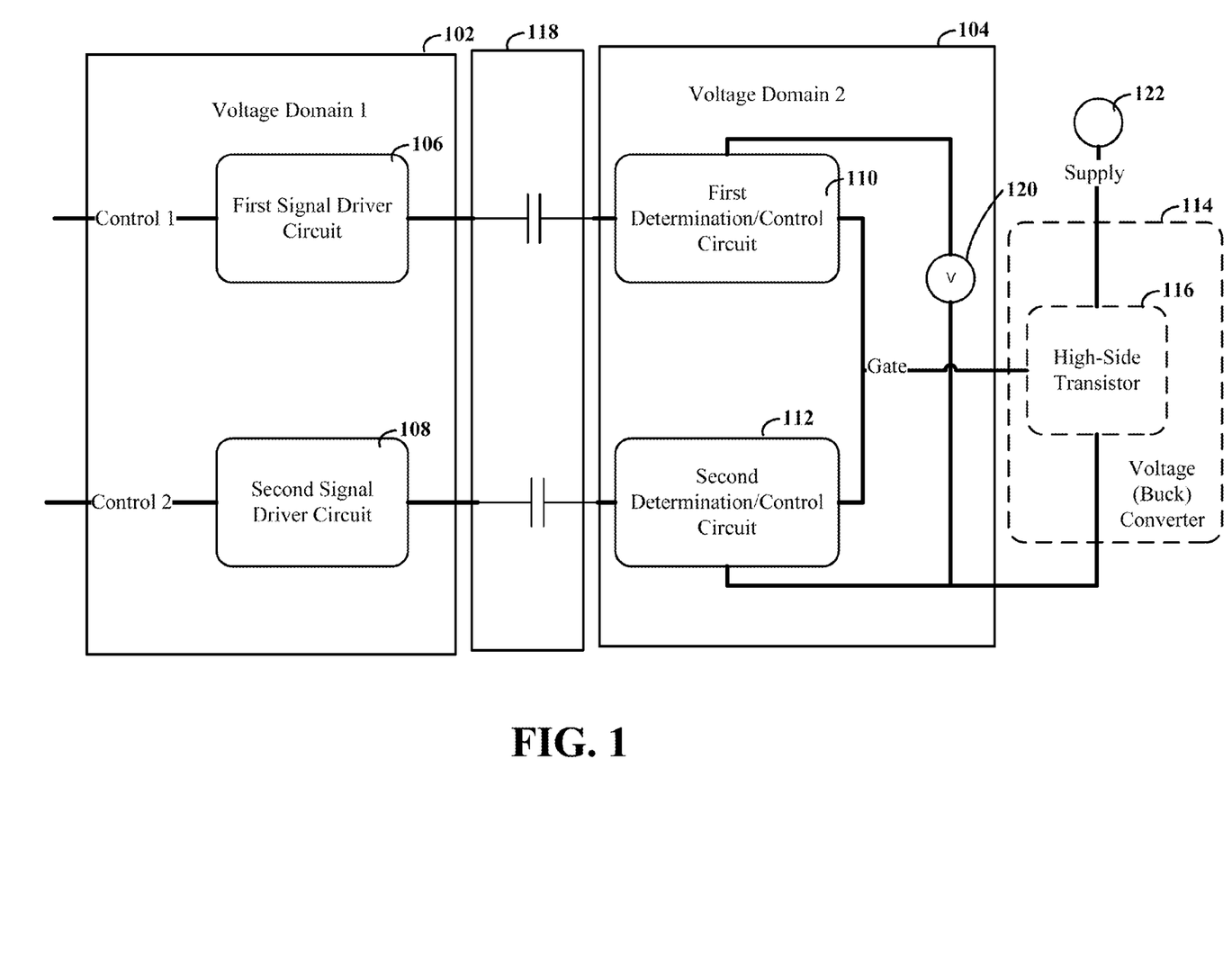
FIG. 1 depicts a block diagram of a system for controlling a signal driver, consistent with embodiments of the present disclosure.

Turning now to the figures, FIG. 1 depicts a block diagram of a system for controlling a signal driver, consistent with embodiments of the present disclosure. The block diagram of FIG. 1 shows electrical circuits in two different voltage domains 102 and 104. Control signals (e.g., Control 1 and Control 2) are generated at voltage levels within the first voltage domain 102. The output signals of the depicted system are in the second voltage domain 104. Thus, the system provides level shifting functions that allow the control signals in the first voltage domain 102 to be communicated to circuits in the second voltage domain 104. As discussed herein, level shifting of signals can be particularly useful for use with voltage converter circuits 114 and associated (high-side) transistors 116. Notwithstanding, one or more of the level-shifting systems, circuits and methods discussed herein can also be used in connection with other circuits and between different voltage domains. For instance, a level shifter circuit can be used to transfer the output signal of a comparator on a high-side voltage to signal processing circuits on the low voltage domain.

In particular embodiments, control modules/circuitry can be configured to generate the control signals, which that the system then communicates to the second voltage domain 104. This control circuitry can be implemented using, as non-limiting examples, digital logic, discrete circuit elements, programmable logic devices, and/or processor circuitry. Accordingly, the first voltage domain 102 can be defined using voltages suitable for such control circuitry. The second voltage domain 104 can be configured according to the output of a voltage converter module/circuit. For instance, a buck converter can convert a source voltage to a high voltage output. This high voltage output can correspond to the second voltage domain 104.

Accordingly, embodiments of the system depicted in FIG. 1 can be used to control the gate of power transistor(s) 116 used as part of a voltage converter circuit 114. In particular embodiments, the power transistor can be configured as a high-side transistor 116. The system can be specially configured with the gate control circuits (first and second determination circuits) 110, 112 that are stateless control circuits. These control circuits 110, 112 can be configured to determine the presence or absence of a control signal on respective input/control lines and to drive an output (gate) signal based upon the determination. Accordingly, the control circuits 110, 112 can be configured without memory elements for storing current or previous states.

Consistent with embodiments, the control/gate driver circuits 110, 112 can be supplied from a voltage source 120. In certain embodiments, this voltage source 120 can provide a voltage of between 5V and 10V. This voltage determines voltage provided to the gate of the high side transistor 116.

The drain of the high side transistor can then be connected to a different (high) voltage supply 122. This voltage supply 122 can be implemented as a bootstrap capacitor since it only needs to deliver a voltage for a limited time (e.g., until it is recharged).

In particular embodiments, the control circuits 110, 112 are communicatively coupled to first and second control signal driver circuits 106, 108 through an isolation circuit 118. For example, isolation circuit 118 can be configured to provide isolation using capacitive coupling. Consistent therewith, control signal driver circuits 106, 108 can be configured and arranged to generate an AC signal. The AC signal creates an electric field that changes with the level of charge on a capacitor plate. The control circuits 110, 112 can detect the level of charge across the isolation barrier 118. In certain embodiments, the control signal driver circuits 106, 108 can use a form of ON-OFF keying. For example, the control signal driver circuits 106, 108 can use the presence of an AC signal to indicate that the gate should be driven in a particular manner. The absence of an AC signal indicates that the gate should not be driven in that manner.

Figure 2:
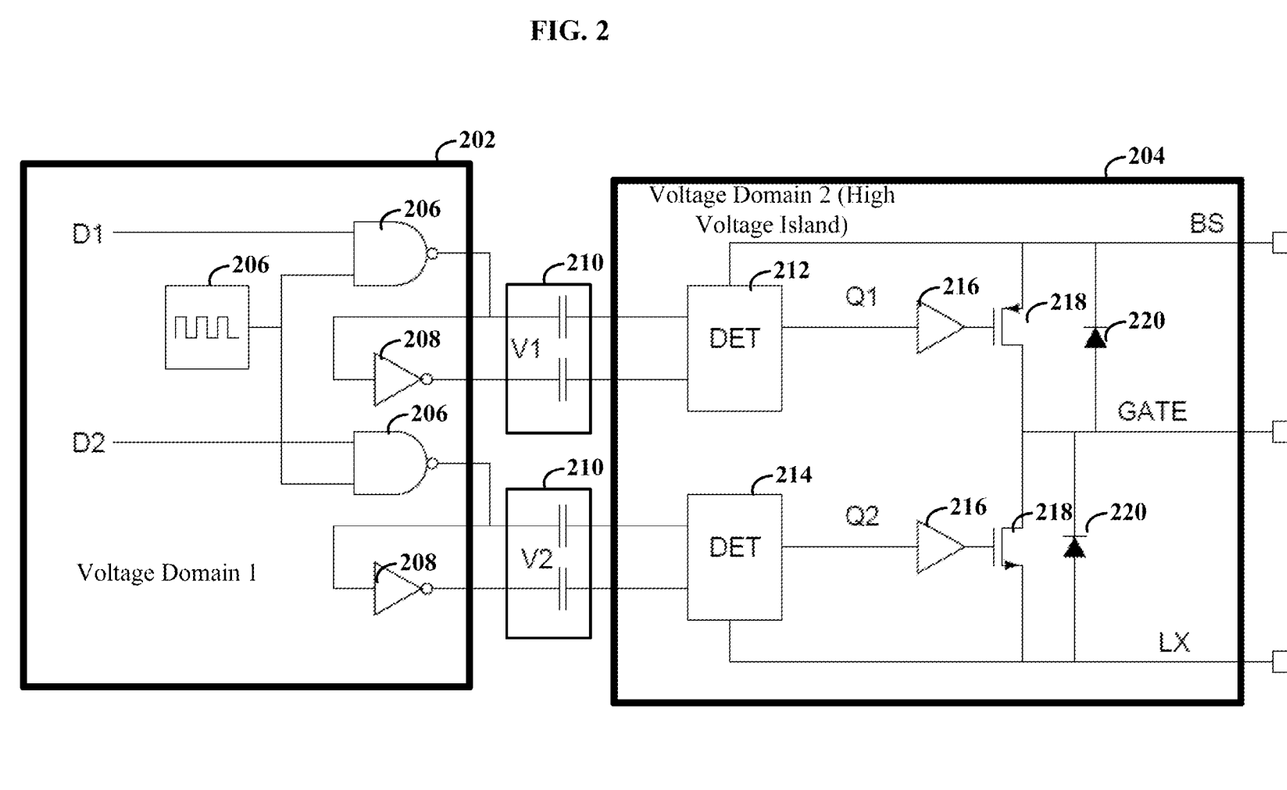
FIG. 2 depicts logic circuitry for use in connection with a system for controlling a signal driver, consistent with embodiments of the present disclosure.

FIG. 2 depicts logic circuitry for use in connection with a system for controlling a signal driver, consistent with embodiments of the present disclosure. FIG. 2 depicts digital logic circuitry for generating an alternating signal for communicating between voltage domains 202 and 204. More particularly, FIG. 2 shows digital logic circuitry for generating differential signals representing each of incoming signals D1 and D2. Incoming signals D1 and D2 can be used in combination with an AC (or radio frequency) signal to produce differential signal formatted using ON-OFF keying. This ON-Off keying uses the presence or absence of the AC signal to convey information. The AC signal can be provided by a signal generation circuit 206. Logic gates 206 selectively pass the AC signal depending upon the state of respective incoming signals D1 and D2. Inverter circuits 208 create a voltage differential at V1 and V2. This voltage differential creates a differential signal that is passed through (capacitive) isolation circuitry 210.

Determination/detection circuits 212 and 214 are configured and arranged to detect the presence or absence of an AC signal received from capacitive isolation circuitry 210. This detection can be accomplished using a variety of different detection circuits including, but not limited to, frequency selective resonator circuits, rectifier circuits, local oscillators, analog to digital converters and combinations thereof. Upon detecting the presence (or absence) of an AC signal, the detection circuits 212 and 214 can be configured to drive an output signal to a corresponding voltage in the second voltage domain 204. For instance, detection circuit 212 can be configured to drive an output (gate) signal to a high voltage (BS) and detection circuit 214 can be configured to drive an output (gate) signal to a low voltage (LX). This can be accomplished using additional single driver circuitry including, but not limited to, signal drivers/buffers 216 and transistors 218. Protection diodes 220 can also be included in certain embodiments.

The logic circuitry of FIG. 2 can be particularly useful for facilitating individual control over both high and low driving of the output (gate) signal. For instance, it may be desirable to implement a delay between the disabling of one of the transistors 218 and the enabling of another of the transistors 218 (e.g., to prevent shoot through of the transistors). Moreover, the state of the output (gate) signal can be known at startup.

Figure 3:
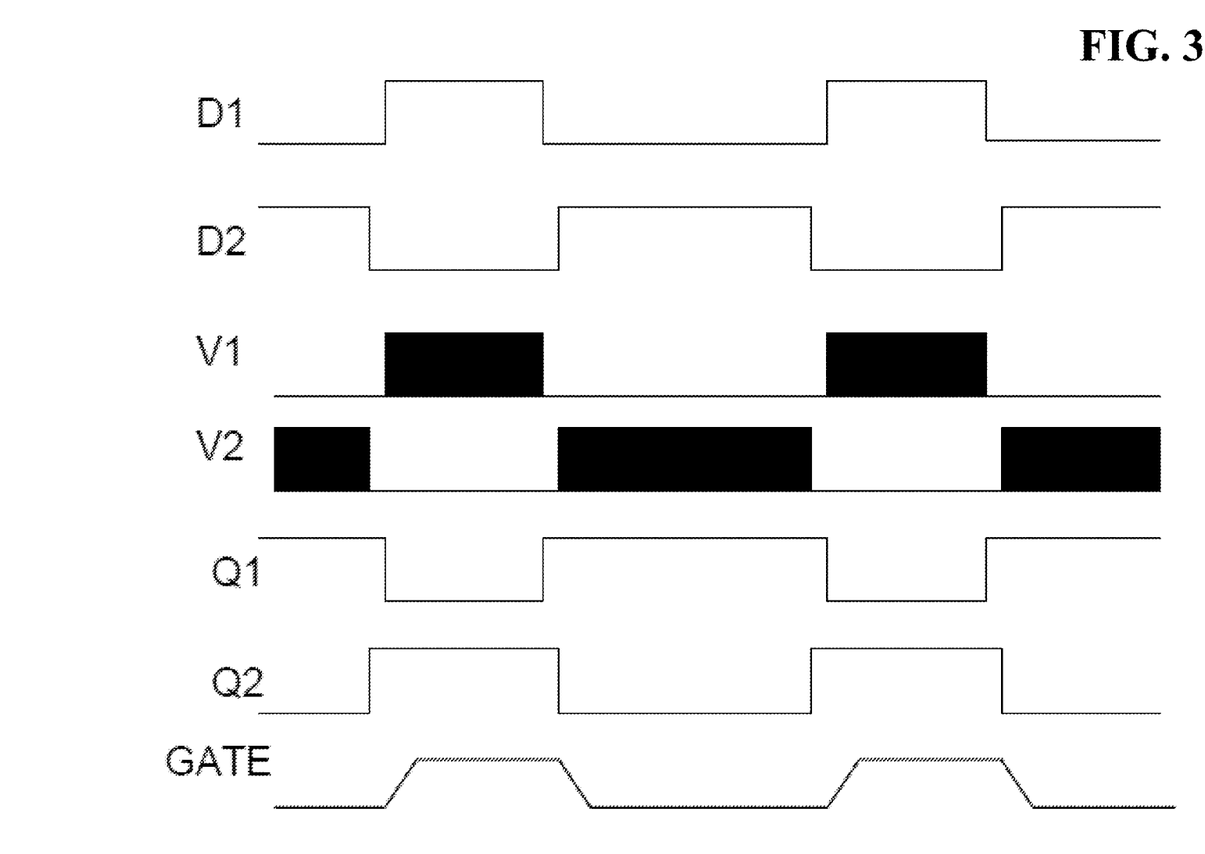
FIG. 3 depicts a timing diagram of signals for use in connection with a system for controlling a signal driver, consistent with embodiments of the present disclosure.

FIG. 3 depicts a timing diagram of signals for use in connection with a system for controlling a signal driver, consistent with embodiments of the present disclosure. Control signals D1 and D2 can determine when an AC signal is presented to the corresponding capacitive isolation circuits (in a first voltage domain). This AC signal is represented by waveforms V1 and V2. Q1 and Q2 represent the control signals (e.g., from FIG. 2) that are generated in response to detecting the presence (or absence) of the AC signal in the second voltage domain. Signals Q1 and Q2 are then used to control the output (gate) signal.

Figure 4:
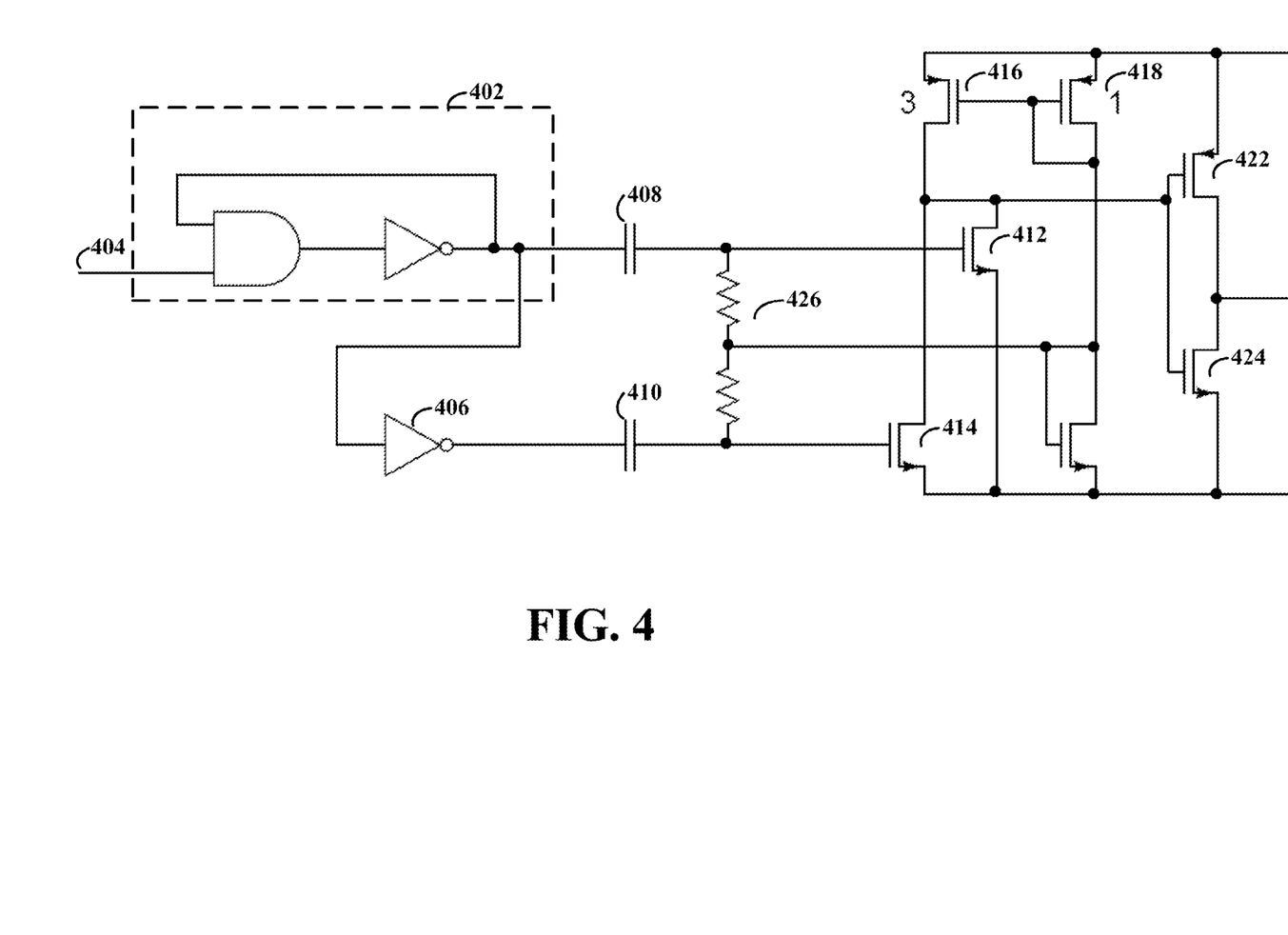
FIG. 4 shows a logic circuitry for differential signaling that is used in connection with a system for controlling a signal driver, consistent with embodiments of the present disclosure.

FIG. 4 shows a logic circuitry for differential signaling that is used in connection with a system for controlling a signal driver, consistent with embodiments of the present disclosure. Circuit 402 functions as an oscillator circuit that is controllable by the presence or absence of input signal 404. This oscillator circuit 402 generates the carrier wave in response to a first signal level of input signal 404 (e.g., a high voltage) and generates a steady state voltage (e.g., zero volts) in response to a second, different signal level (e.g., a low voltage). Inverter 406 is configured to generate a differential signal when combined with the output of circuit 402. In particular, the signals provided to capacitors 408 and 410 can be opposite in phase to one another.

The other side of capacitors 408 and 410 can be connected to the gates of (NMOS) transistors 412 and 414. Current can be provided to transistors 412 and 414 from a 1:3 current mirror, which includes (PMOS) transistors 416 and 418. When no AC signal is present, the current mirror provides more current than the transistors 412 and 414 and the input of the inverter (formed by transistors 422 and 424) is driven high. This causes the output of the inverter to be driven low. When an AC signal is present, the average current in the transistors 412 and 414 increases, i.e., due to the nonlinear transfer function of the transistors. This causes the current through transistors 412 and 414 to exceed that of the current mirror, which results in the input of the inverter being driven low and the output of the inverter to be driven high.

Embodiments of the present disclosure are recognize that the capacitance values for the capacitors 408 and 410 can be chosen to ensure that the differential AC signal generates a voltage across the voltage divider network 426 that is large enough to create a sufficient increase in current through transistors 412 and 414. For instance, the capacitance value can be selected as a function of the expected frequency of the AC signal.

Figure 5:
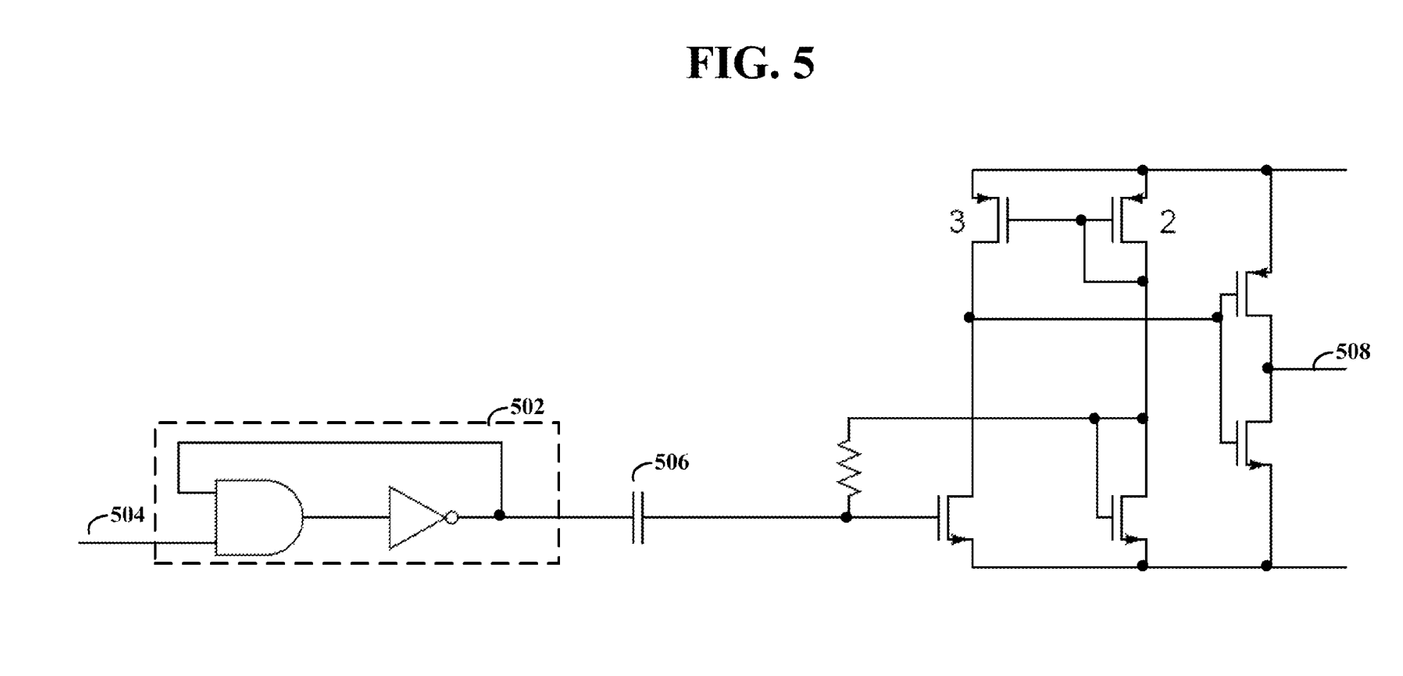
FIG. 5 shows a logic circuitry for single-ended signaling that is used in connection with a system for controlling a signal driver, consistent with embodiments of the present disclosure.

FIG. 5 shows a logic circuitry for single-ended signaling that is used in connection with a system for controlling a signal driver, consistent with embodiments of the present disclosure. Oscillator circuit 502 generates an AC signal in response to input signal 504. The AC signal is presented to capacitor 506, which capacitive couples the signal to a second voltage domain. Similar to the circuit discussed in connection with FIG. 4, the presence or absence of an AC signal determines whether or not the output signal 508 is driven high or low. The particular ratio of the current mirror is depicted as 2:3 in FIG. 5 and 1:3 in FIG. 4, however, these ratios can be adjusted according to the particular application and circuit parameters.

Because the circuit of FIG. 5 does not provide a return path for current, the system may produce more RF emissions than if differential signaling was used (e.g., as shown in connection with FIG. 4). Aspects of the present disclosure recognize that the effect of such emissions can be mitigated by designing the oscillator circuit 502 with a frequency sufficiently outside of critical frequency bands (e.g., frequencies over 1 GHz).

Unless otherwise stated, the various embodiments discussed herein can be used together in a variety of different combinations. Each and every possible combination is not necessarily expressly recited. Various modules and/or other circuit-based building blocks may be implemented to carry out one or more of the operations and activities described herein and/or shown in the figures. In such contexts, a "module" or "block" is a circuit that carries out one or more of these or related operations/activities. For example, in certain of the above-discussed embodiments, one or more modules are discrete logic circuits or programmable logic circuits configured and arranged for implementing these operations/activities, as in the circuit modules shown in the figures. In certain embodiments (e.g., to provide the control logic), the programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a processor hardware-based circuit and a set of instructions in the form of firmware, where the first module includes a first processor hardware circuit with one set of instructions and the second module includes a second processor hardware circuit with another set of instructions.

Based upon the above discussion and illustrations, those skilled in the art will readily recognize that various modifications and changes may be made to the various embodiments without strictly following the exemplary embodiments and applications illustrated and described herein. For example, the level shifting function can be used to shift from a high voltage domain to a lower voltage domain. In other examples, different types and combinations of transistors can be used (e.g., PMOS vs. NMOS). Such modifications do not depart from the true spirit and scope of various aspects of the invention, including aspects set forth in the claims.

What is claimed is:

1. A device comprising:
   in a first voltage domain,
   a first signal driver circuit configured and arranged to generate a first signal with information that is encoded using a presence of a carrier wave, and
   a second signal driver circuit configured and arranged to generate a second signal with information that is encoded using a presence of a carrier wave;
   in a second voltage domain,
   a first determination circuit, configured and arranged to detect the presence of a carrier wave on a first input, and
   a second determination circuit, configured and arranged to detect the presence of a carrier wave on a second input;
   a first signal path capacitively coupling the first signal to the first input;
   a second signal path capacitively coupling the second signal to the second input;
   a first output circuit configured and arranged to drive, in response to a detection of a carrier wave from the first determination circuit, an output node to a high voltage in the second voltage domain; and
   a second output circuit configured and arranged to drive, in response to a detection of a carrier wave from the second determination circuit, the output node to a low voltage in the second voltage domain.

2. The device of claim 1, wherein the device is configured and arranged to provide level shifting for an input signal that is in the first voltage domain and that carries the information.

3. The device of claim 1, wherein the first output circuit includes a transistor having a drain and a source coupled between a voltage source providing the high voltage and the output node.

4. The device of claim 3, wherein the second output circuit includes a transistor having a drain and a source coupled between a voltage source providing the low voltage and the output node.

5. The device of claim 1, wherein the first and second signal paths are each differential signal paths.

6. The device of claim 1, wherein the first and second signal paths are each single-ended signal paths and wherein the carrier wave for each of the first and second signal has a frequency of at least 1 GHz.

7. The device of claim 1, wherein the first determination circuit includes:
   a current mirror that mirrors a current in a first current path onto a second according to a ratio of the current mirror;
   a resistor divider network between differential signals of the first input; and
   a pair of transistors configured to increase current in the second current path in response to the presence a carrier wave and drive the output by overcoming the mirrored current of the current mirror.

8. The device of claim 1, further including an oscillator circuit that is configured and arranged to generate the carrier wave in response to a first signal level and to generate a steady state voltage in response to a second, different signal level.

9. The device of claim 1, wherein the output is a high-side gate driver circuit.

10. The device of claim 1, wherein the first signal in the first voltage domain has a high voltage value that is less than the high voltage in the second voltage domain.

11. The device of claim 1, wherein the first signal in the first voltage domain has a high voltage value that is more than the high voltage in the second voltage domain.

12. A method comprising:
    in a first voltage domain, generating, using a first signal driver circuit a first signal with information that is encoded using a presence of a carrier wave, and
    generating, using a second signal driver circuit, a second signal with information that is encoded using a presence of a carrier wave;
    capacitively coupling, using a first signal path, the first signal to a first input in a second voltage domain;
    capacitively coupling, using a second signal path, the second signal to a second input in the second voltage domain;
    in the second voltage domain,
    detecting, using a first determination circuit, the presence of a carrier wave on the first input, and
    detecting, using a second determination circuit, the presence of a carrier wave on the second input;
    driving, using a first output circuit and in response to detecting the presence of a carrier wave using the first determination circuit, an output node to a high voltage in the second voltage domain; and
    driving, using a second output circuit and in response to detecting the presence of a carrier wave using the second determination circuit, the output node to a low voltage in the second voltage domain.

13. The method of claim 12, wherein the step of generating the first signal includes using an oscillator circuit to generate an alternating current (AC) signal.

14. The method of claim 12, wherein the step of generating the first signal includes generating a differential signal.

15. The method of claim 12, wherein the step of detecting the presence of a carrier wave on the first input includes increasing current through a transistor fed by a current mirror and thereby overcoming a counteracting current.

16. The device of claim 1, wherein the first signal is a first control signal that indicates an ON state for a high-side transistor, and the second signal is a second control signal that indicates an OFF state for the high-side transistor.

17. The device of claim 1, wherein the output node is connected to a gate of a high-side transistor.

18. The device of claim 1, wherein the first determination circuit is configured to detect the presence of a carrier wave when there is no carrier wave present on the second input.

19. The method of claim 12, wherein the generating the first signal is responsive to a first input data signal and generating the first signal is responsive to a second input data signal that is separately controllable from the first input data signal.

20. The method of claim 19, wherein the first input data signal indicates an ON state for a high-side transistor and the second input data signal indicates an OFF state for the high-side transistor.

* * * * *